(12) United States Patent
Suzuki et al.

(10) Patent No.: US 6,450,034 B1
(45) Date of Patent: Sep. 17, 2002

(54) METHOD AND APPARATUS FOR MEASURING AND ADJUSTING RESONANCE FREQUENCY OF RESONATORS

(75) Inventors: Masanobu Suzuki, Toki; Genichi Tsuzuki, Nishikamo-gun, both of (JP)

(73) Assignee: Cryodevice Inc., Nisshin (JP)

( * ) Notice: Subject to any disclaimer, the term of this patent is extended or adjusted under 35 U.S.C. 154(b) by 84 days.

(21) Appl. No.: 09/625,866

(22) Filed: Jul. 26, 2000

(30) Foreign Application Priority Data

Apr. 28, 2000 (JP) ........................................ 2000-130811

(51) Int. Cl.[7] .............................. G01R 27/04; H01P 1/20
(52) U.S. Cl. ......................... 73/579; 324/633; 333/205
(58) Field of Search .......................... 73/579; 333/17.1, 333/205, 235, 995; 505/210, 700, 701, 866; 324/633, 636, 637

(56) References Cited

U.S. PATENT DOCUMENTS

| | | | |
|---|---|---|---|
| 5,712,606 A | * 1/1998 | Sarkka | 333/235 |
| 5,786,740 A | * 7/1998 | Ishikawa et al. | 333/235 |
| 6,130,591 A | * 10/2000 | Tsuzuki | 333/204 |
| 6,313,722 B1 | * 11/2001 | Tsuzuki et al. | 333/205 |
| 6,317,017 B1 | * 11/2001 | Takenaka | 333/235 |
| 6,329,824 B1 | * 12/2001 | Tsuzuki et al. | 324/633 |

* cited by examiner

Primary Examiner—Helen Kwok
(74) Attorney, Agent, or Firm—Law Offices of David G. Posz

(57) ABSTRACT

A filter has a plurality of resonators formed regularly on a substrate and made of a superconducting material. In measuring resonance frequency of the resonators, the filter and a conductive metal plate having an opening are placed in a vacuum chamber so that all the resonators other than one resonator which faces the opening are covered with the metal plate. The metal plate has an input probe and an output probe at the opening of the metal plate. The resonance frequency of each resonator is measured in sequence while rotating the metal plate. Each resonator is adjusted in shape by a laser trimming or providing a dielectric film in correspondence with the measured resonance frequency so that all the resonators have a fixed resonance frequency.

16 Claims, 7 Drawing Sheets

US 6,450,034 B1

METHOD AND APPARATUS FOR MEASURING AND ADJUSTING RESONANCE FREQUENCY OF RESONATORS

CROSS REFERENCE TO RELATED APPLICATION

This application relates to and incorporates herein by reference Japanese Patent Application No. 2000-130811 filed on Apr. 28, 2000.

BACKGROUND OF THE INVENTION

The present invention relates to a method and apparatus for measuring and adjusting resonance frequency of resonators.

In conventional filters having resonators, the resonance frequency of each resonator is adjusted by means of a dielectric material used in the filters or by trimming a conductive pattern of the resonator by a laser or the like. In the former adjustment, the effective permittivity is adjusted by a screw equipped with the dielectric material at the head thereof. In the latter adjustment, the conductive pattern is partlycut out by the laser.

In either case, the resonance frequency is adjusted while checking for the response of the filter provided on a measuring apparatus. It is therefore difficult to determined how much each resonator should be adjusted, particularly when the number of resonators increases and the number of locations of the required adjustment increases.

It is proposed to measure the resonance frequency of each resonator individually by the use of probes. However, if a plurality of resonators are provided on a single substrate, a resonator to be subjected to the resonance frequency measurement and other resonators interfere each other through electromagnetic coupling. Therefore, the probes do not ensure an accurate measurement of the resonance frequency of each of the resonators.

SUMMARY OF THE INVENTION

It is therefore an object of the present invention to provide a method and apparatus for measuring and adjusting resonance frequency of a plurality of resonators individually without being influenced by electromagnetic coupling between the resonators.

According to the present invention, a plurality of resonators are formed on a substrate. In measuring resonance frequency of the resonators, a conductive plate having an opening are placed above the substrate so that all the resonators other than one resonator which faces the opening are covered with the conductive plate. The resonance frequency of each resonator is measured in sequence while moving at least one of the conductive plate or the substrate.

Preferably, each resonator is made of a superconducting material and the resonance frequency is measured in a vacuum chamber. Each resonator is adjusted in shape by a laser trimming or providing a dielectric film in correspondence with the measured resonance frequency so that all the resonators have a fixed resonance frequency.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
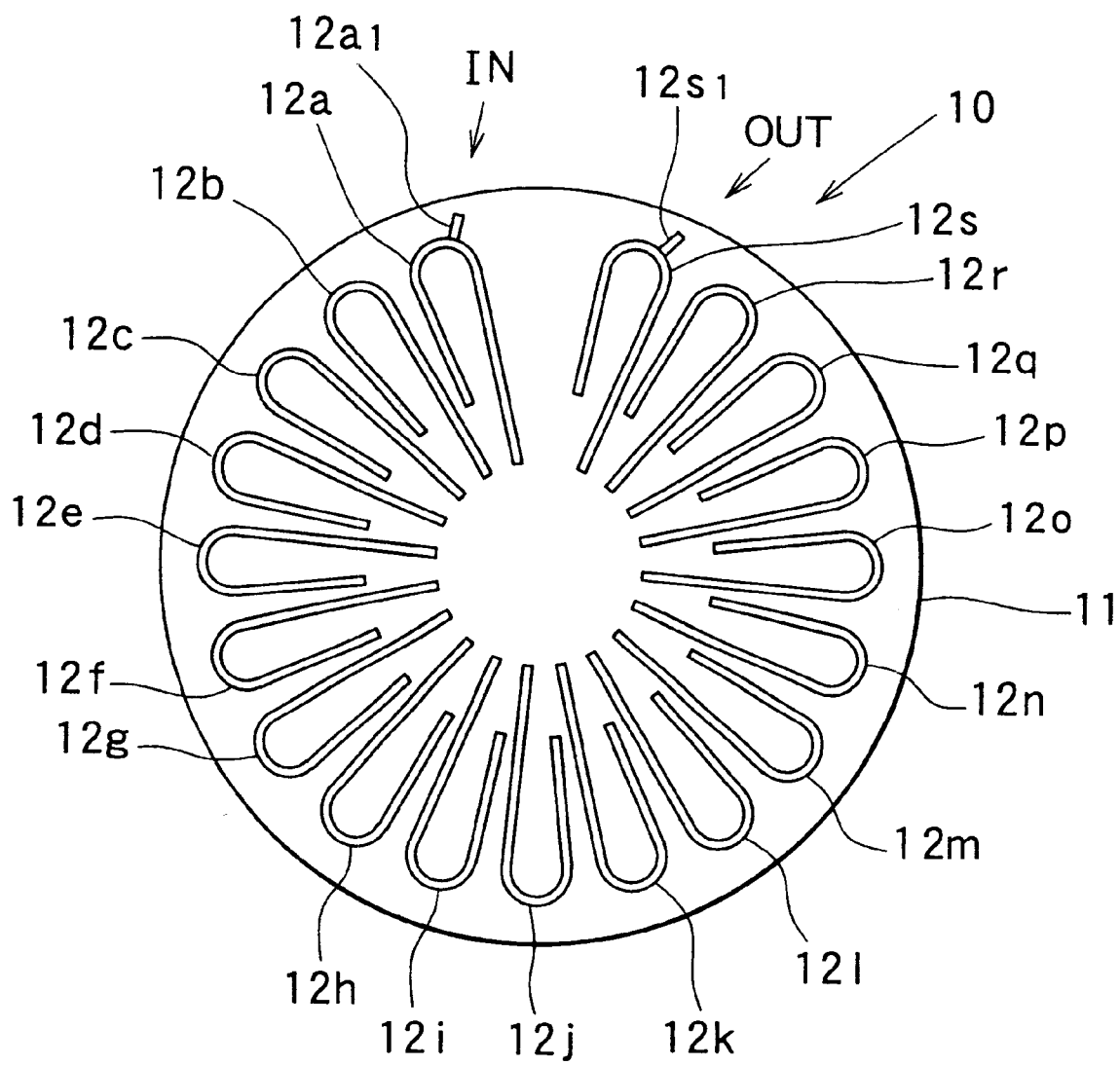
FIG. 1 is a plan view showing a filter including a plurality of resonators which are subjected to a resonance frequency measurement in an embodiment of the present invention.

Referring first to FIG. 1, a filter 10 that is subjected to a resonance frequency measurement is constructed as a distributed constant-type. A dielectric substrate 11 is formed thereon a plurality of resonators 12a to 12s on its top surface and a ground plane on its bottom surface. The resonators 12a to 12s are formed in a microstrip line shape.

The substrate 11 is shaped in a disk. The resonators 12a to 12s are arranged circularly to surround the center of the disk in generally a regular angular interval except at one location between the first resonator 12a and the last resonator 12s. The resonators 12a to 12s are open at this location. Each of the resonator 12a to 12s has a length (loop length) which corresponds to a half of the wavelength ($\lambda$). Electrical wires 12a 1 and 12s 1 are tap-connected to the resonators 12a and 12s, respectively. The wires 12a 1 and 12s 1 are used for receiving input signals (IN) to be signal filtered and producing signal filtered output signals (OUT), respectively.

The resonators 12a to 12s, wires 12a 1 and 12s 1 and the ground plane are all formed with a film of superconducting material so that the filter 10 may be used as a superconducting filter.

Figure 2:
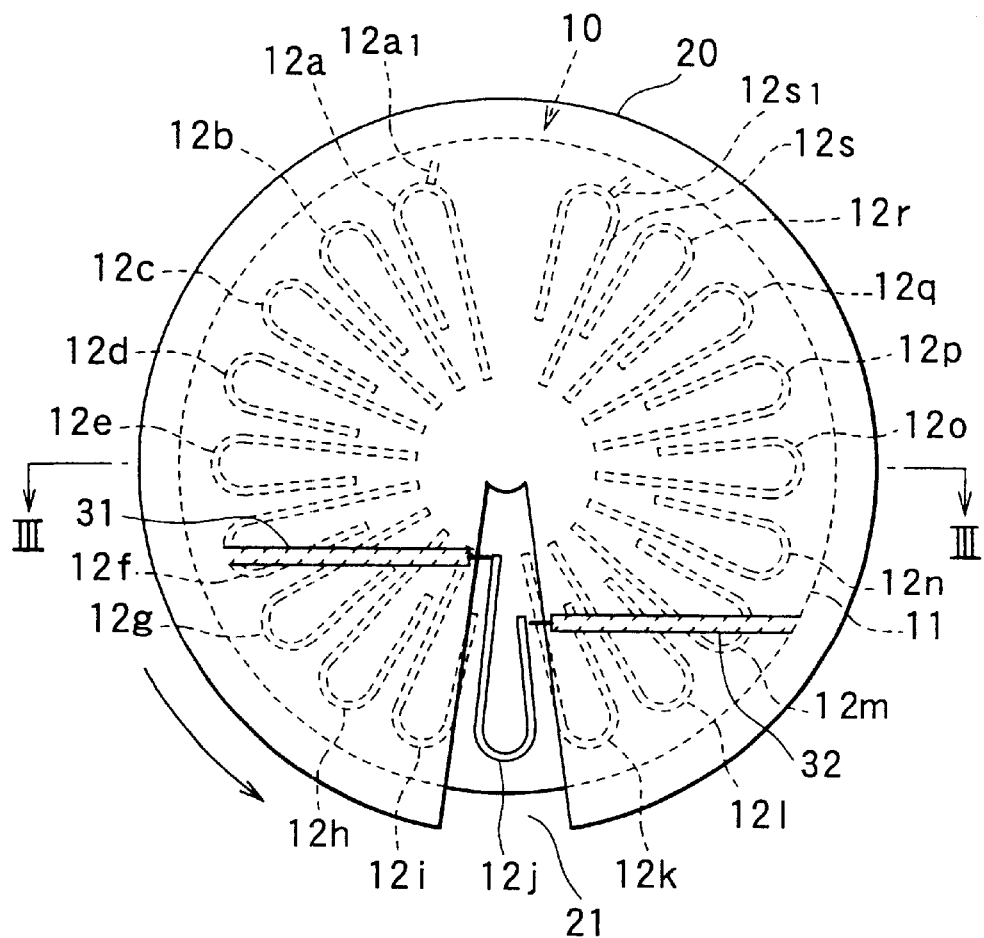
FIG. 2 is a plan view showing the filter which is held under a resonance frequency measurement condition.
Figure 3:
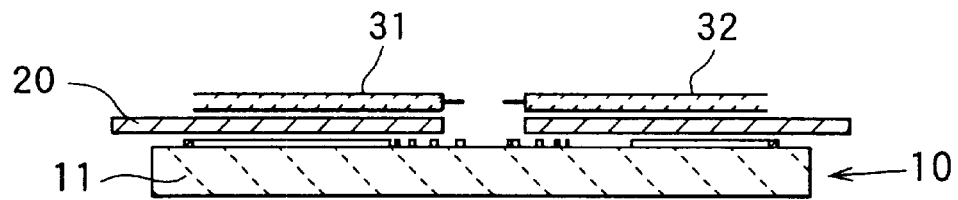
FIG. 3 is a sectional view showing the filter which is held under the resonance frequency measurement condition, the cross section being taken along a line III—III in FIG. 2.

In measuring the resonance frequency of the resonators 12a to 12s, the filter 10 is covered with a conductive metal plate 20 as shown in FIGS. 2 and 3, while providing uniformly a narrow gap between the resonators 12a to 12s and the metal plate 20. The metal plate 20 is shaped in a disk which is larger in diameter than the substrate 11. The metal plate 20 has a slit 21 so that only one resonator that is subjected to the resonance frequency measurement, for instance resonator 12j in FIG. 2, is not covered with the metal plate 20. An input probe 31 and an output probe 32 are placed above the metal plate 20 to measure the resonance frequency of the resonator 12j. Specifically, the tip ends of the probes 31 and 32 are placed above the conductive pattern of the resonator 12j.

The metal plate 20 placed above the resonators causes the resonance frequency of such plate-covered resonators not to affect. That is, the metal plate 20 protects the resonator 12j from being interfered with the other resonators 12a–12i and 12k–12s that are covered with the metal plate 20. Thus, the resonance frequency of the resonator 12*j* can be measured accurately by the probes 31 and 32.

As the resonators 12*a* to 12*s* are arranged regularly in a circumferential direction of the substrate 11, the resonance frequency of each resonator is measured one by one in sequence by rotating either the substrate 11 or the metal plate 20. It is preferred that the probes 31 and 32 are directly or indirectly fixed to the metal plate 20, so that the probes 31 and 32 need not be moved during the measurement of the resonance frequency.

Figure 4:
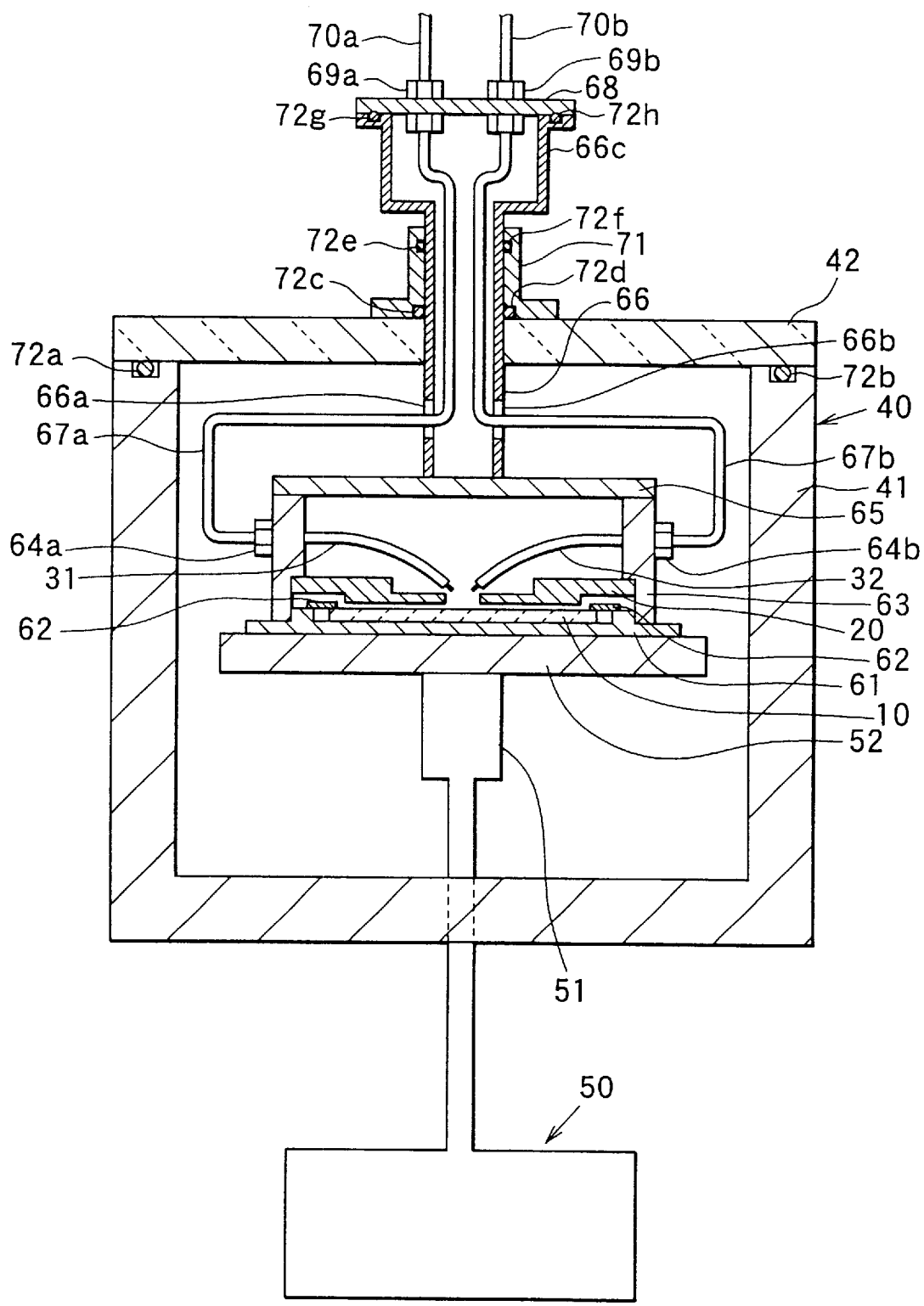
FIG. 4 is a schematic sectional view showing a resonance frequency measuring apparatus according to the embodiment.

A resonance frequency measuring apparatus may be constructed as shown in FIG. 4. The filter 10 shown in FIG. 1 is held within a thermally insulated vacuum chamber 40. The chamber of the capsule 40 is connected to a cooler 50 so that the resonance frequency measurement is attained while being cooled. A cold stage (thermal conducting plate) 52 is attached to a cold head 51 of the cooler 50. A holder plate 61 is fixed to the cold stage 52 to hold the filter 10 thereon.

Figure 5:
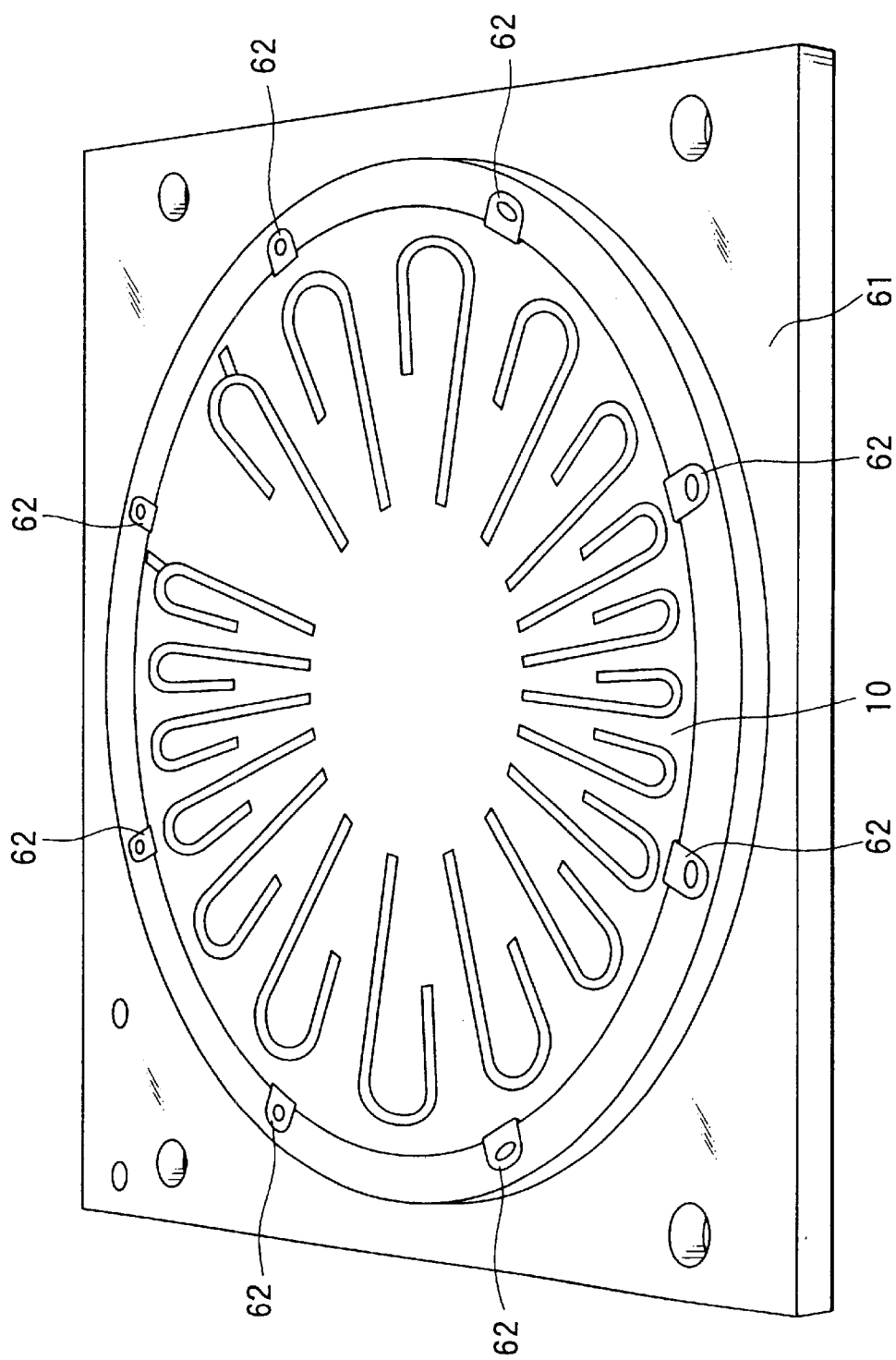
FIG. 5 is a perspective view showing the filter mounted on a holder plate for the resonance frequency measurement.
Figure 6:
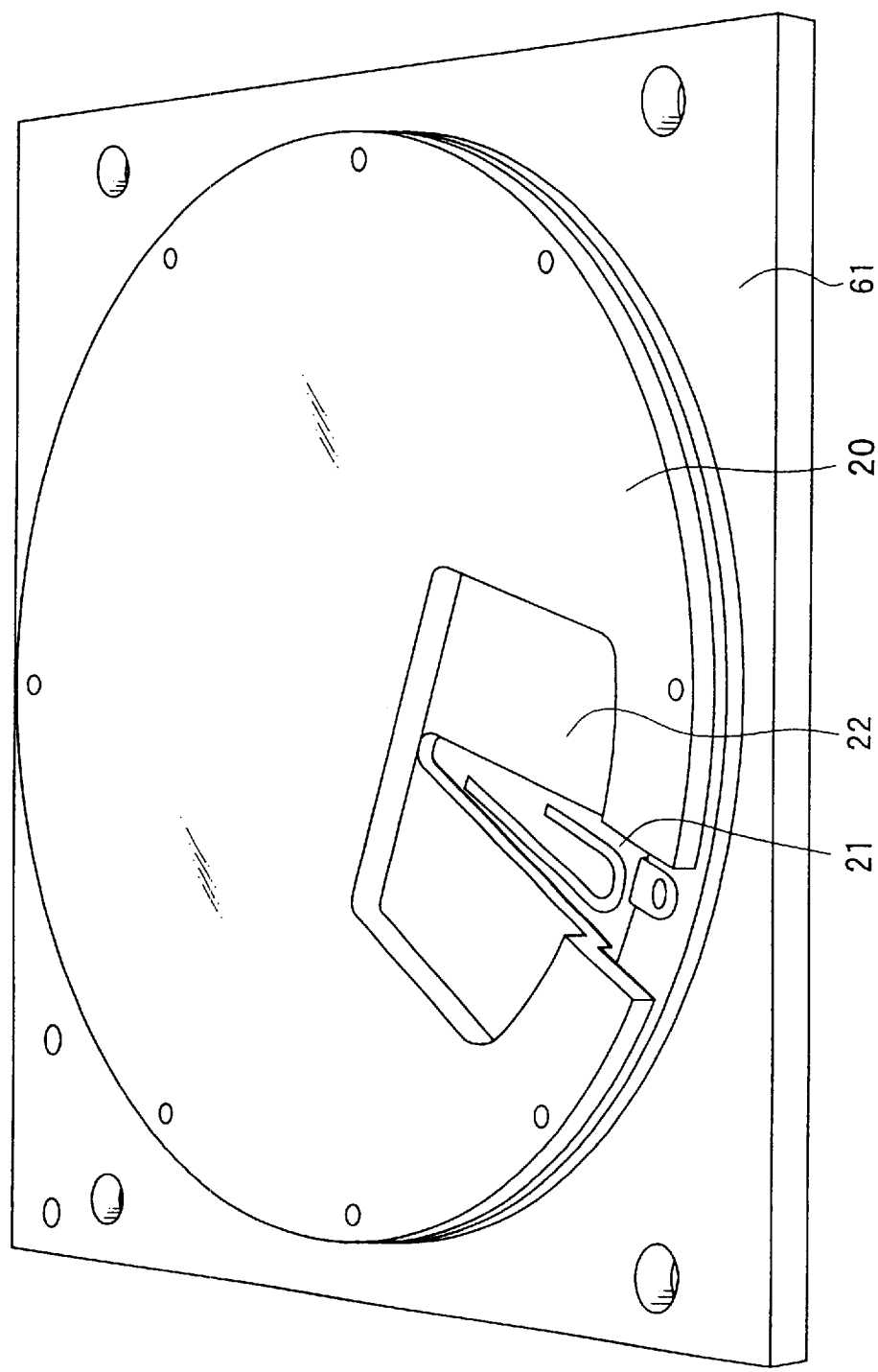
FIG. 6 is a perspective view showing a metal plate mounted in the holder plate for the resonance frequency measurement.

As shown in FIG. 5 in detail, the filter 10 is fixedly held above the holder plate 61 by pressers 62. The metal plate 20 is placed in position above the holder plate 61 as shown in FIG. 6. The metal plate 20 has a recess 22, and the slit 21 is formed in the recess 22. Specifically, the metal-plate 20 is fixed to a side wall ring 63, and the side wall ring 63 is placed on the holder plate 61 as shown in FIG. 4. Thus, the metal plate 20 is disposed in parallel with the substrate 11 with a uniform gap therebetween.

Figure 7:
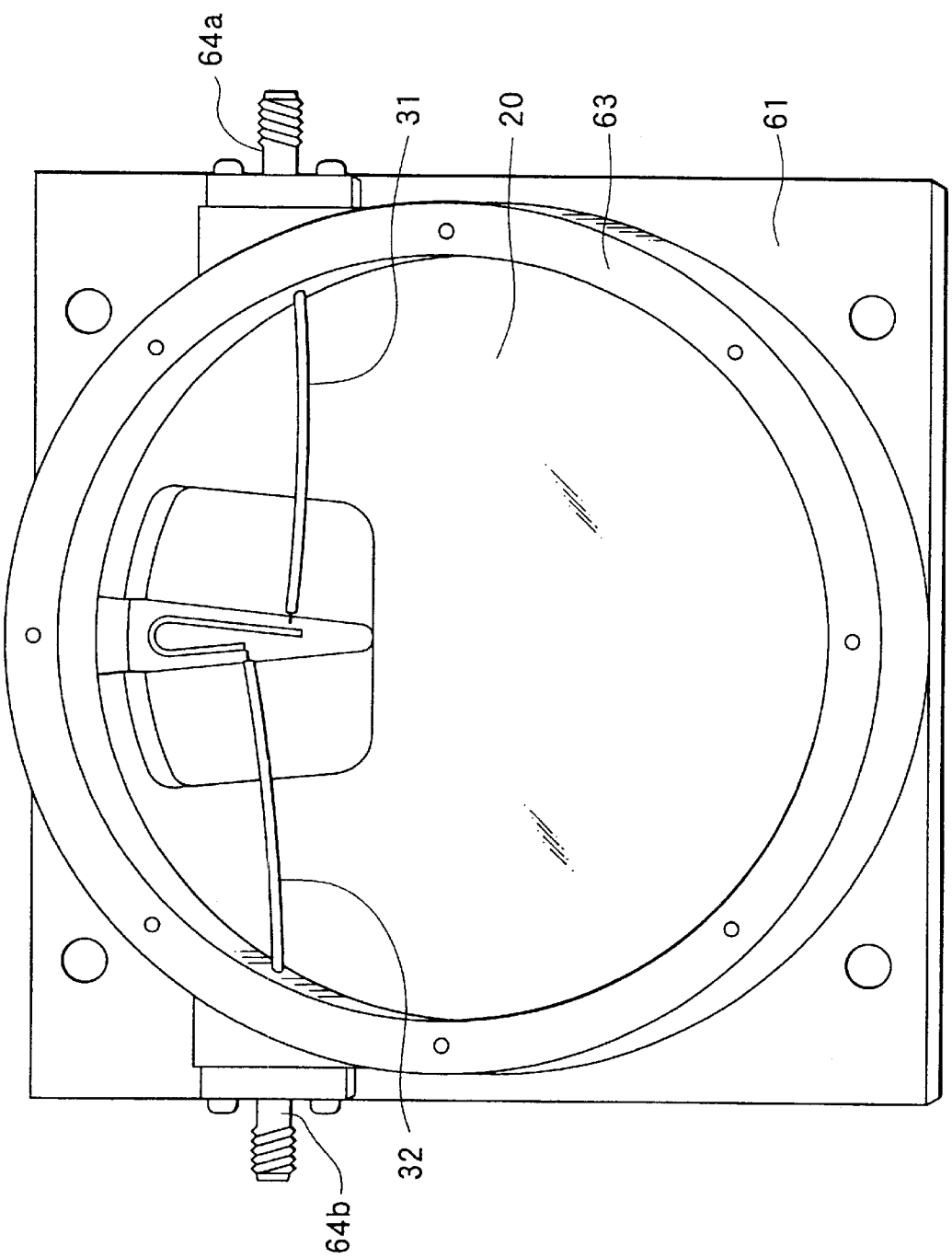
FIG. 7 is a perspective view showing the metal plate fixed to a side wall ring and mounted on the holder plate for the resonance frequency measurement.

As shown FIG. 7, a pair of connectors 64*a* and 64*b* are attached to the side wall ring 63. The input probe 31 and the output probe 32 are connected to the connectors 64*a* and 64*b*, respectively. The side wall ring 63 to which the metal plate 20 is fixed is rotated in the circumferential direction so that the resonators 12*a* to 12*s* are placed in facing relation with the probes 31 and 32 through the slit 21 for the measurement of the resonance frequency.

As shown in FIG. 4, a lid 65 is attached to the side wall ring 63. A cylindrical tube 66 made of a metal (for instance, SUS) is attached to the lid 65. The cylindrical tube 66 has a pair of holes 66*a* and 66*b* through which flexible coaxial cables 67*a* and 67*b* connected to the connectors 64*a* and 64*b* pass. The cylindrical tube 66 has an enlarged head 66*c* on which a lid 68 is attached. A pair of connectors 69*a* and 69*b* are attached to the lid 68 so that the cables 67*a* and 67*b* are connected to external cables 70*a* and 70*b* through the connectors 69*a* and 69*b*, respectively.

The cylindrical tube 66 is held rotatably through a cylindrical guide 71 fixed to the lid 42 of the vacuum chamber 40. A plurality of O-rings 72*a* to 72*h* is provided to maintain air-tightness of the inside of the chamber 40.

In the resonance frequency measurement and adjustment operation, the enlarged head 66*c* of the cylindrical tube 66 is rotated manually to rotate the side wall ring 63. The metal plate is rotated integrally with the side wall ring 63, while the filter 10 is maintained held fixedly on the holder plate 61 and cooled in the vacuum chamber 40. Each resonance frequency of the resonators 12*a* to 12*s* is thus measured by the probes 31 and 32 one by one during rotation of the filter 10. The rotational angle of the cylindrical tube 66 may be adjusted by an angle adjusting screw (not shown) provided on the enlarged head 66*c* of the cylindrical tube 66.

After the resonance frequencies of all the resonators 12*a* to 12*s* are measured, the resonance frequency of each resonator is adjusted to a fixed resonance frequency to compensate for a deviation of the measured frequency from the fixed frequency. The resonance frequency is adjusted by trimming the conductive pattern of each resonator. As the resonators 12*a* to 12*s* are made of a superconducting material, the laser trimming is likely to damage the superconducting material. A photolithography technology used in semiconductor production may preferably be used to trim the conductive patterns of the resonators 12*a* to 12*s* so that the superconducting material will not be damaged.

The resonance frequency of the resonators 12*a* to 12*s* may alternatively adjusted by providing or stacking a dielectric film on the resonators 12*a* to 12*s*, more specifically by adjusting the thickness and or area of the dielectric film on each resonator.

Figure 8:
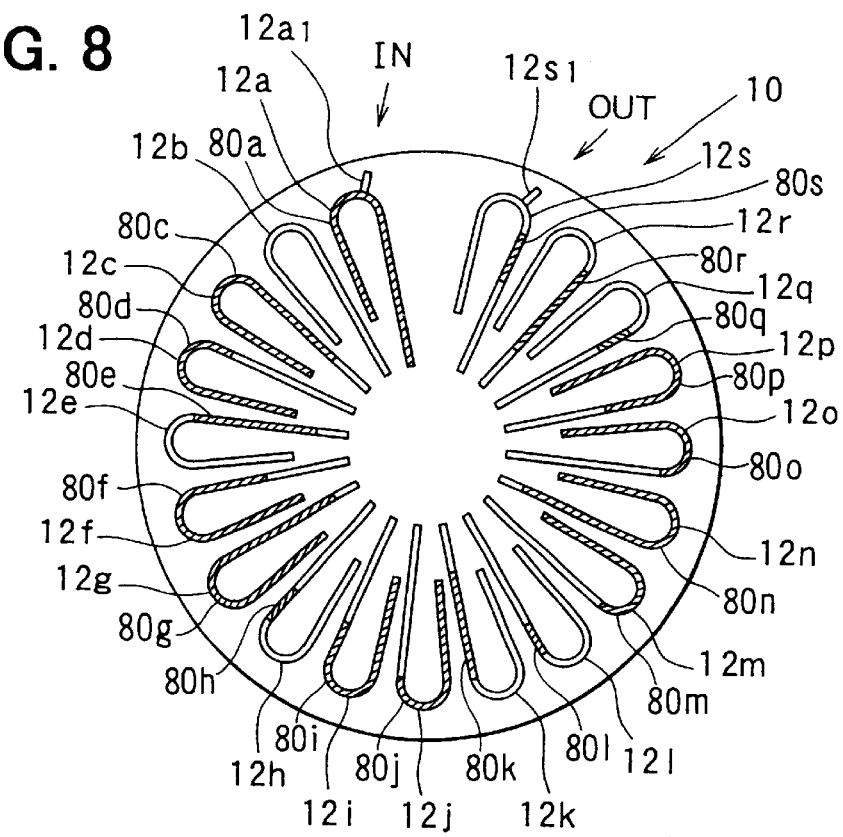
FIG. 8 is a plan view showing the filter in which dielectric films are provided for adjustment of the resonance frequency.
Figure 9A:
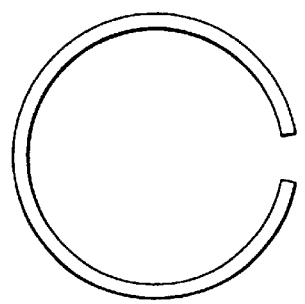
FIGS. 9A to 9D are schematic views showing variations of each resonator for the filter.
Figure 9C:
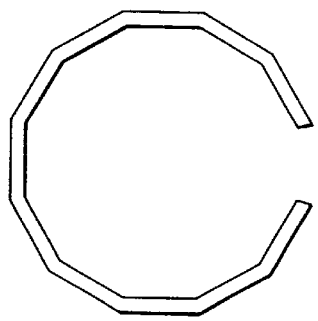
Figure 9B:
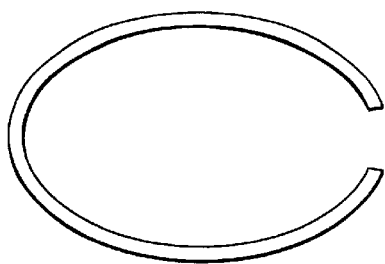
Figure 9D:
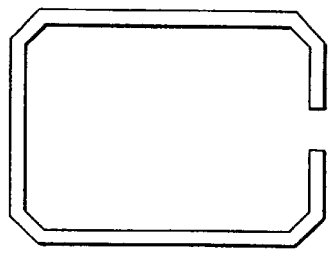

For instance, as shown in FIG. 8, dielectric films 80*a* and 80*c* to 80*s* are provided on the resonators 12*a* and 12*c* to 12*s*, respectively, while no dielectric film is provided on the resonator 12*b*. In this instance, the thickness of each dielectric film is maintained constant, but the area is varied from resonator to resonator depending on the deviation of the measured frequency from the set frequency. The dielectric films 80*a* and 80*c* to 80*s* may be provided on the resonators 12*a* and 12*c* to 12*s* by the use of the photolithography technology, for instance, lift-off. The dielectric material may be $CeO_2$, MgO, $SiO_2$, etc.

The present invention should not be limited the disclosed embodiment, but may be implemented in many other ways. For instance, the resonator may be shaped as shown in FIGS. 9A to 9D. The resonator may be formed with normal conducting material. The metal plate 20 may be manufactured unitarily with the side wall ring 63. The metal plate 20 may be replaced with a plate which has a conducting surface only on a side which faces the resonators 12*a* to 12*s* of the filter 10. The filter may be constructed as a lumped constant-type.

Further, the present invention may also be applied to a signal oscillator which comprises a plurality of resonators.

What is claimed is:

1. A method for measuring resonance frequency of a plurality of resonators formed on a substrate comprising:

covering with a conductive plate all the plurality of resonators other than one resonator which is to be subjected to a resonance frequency measurement; and measuring a resonance frequency of the one resonator while maintaining the all resonators covered with the conductive plate.

2. The method as in claim 1, wherein:

the one resonator is placed to face an opening provided in the conductive plate during the frequency measurement.

3. The method as in claim 2, further comprising:

rotating the conductive plate to move the opening from the one resonator to another resonator so that the resonance frequency of the plurality of resonators are measured one by one.

4. The method as in claim 3, further comprising:

rotating a resonance frequency measuring device provided in the opening together with the conductive plate.

5. The method as in claim 3, further comprising: cooling the plurality of resonators in a vacuum chamber while the conductive plate is rotated during the resonance frequency measurement, each of the plurality of resonators being made of a superconducting material.

6. The method as in claim 2, further comprising:

moving at least one of the conductive plate and the substrate to position the opening of the conductive plate to face the plurality of resonators in sequence so that the resonance frequency of the plurality of resonators are measured one by one.

7. The method as in claim 6, further comprising:

adjusting each conductive pattern of the plurality of resonators in correspondence with the measured resonance frequency so that all of the plurality of resonators have a fixed resonance frequency.

8. The method as in claim 7, wherein: the each conductive pattern of the plurality of resonators is adjusted with a dielectric material provided on the conductive pattern.

9. A method for measuring resonance frequency comprising:

placing, in a vacuum chamber, a filter including a plurality of resonators made of a superconducting material and provided on a substrate, and a conductive plate covering all the plurality of resonators other than one of the plurality of resonators which is to be subjected to a resonance frequency measurement;

cooling the vacuum chamber to cool the filter;

measuring a resonance frequency of the one of the plurality of resonators; and moving at least one of the filter and the conductive plate so that the resonance frequency of the plurality of resonators is measured one by one.

10. The method as in claim 9, wherein:

the resonance frequency of the one of the plurality of resonators is measured each time an opening of the conductive plate is moved to face the one of the plurality of resonators.

11. An apparatus for measuring resonance frequency of a plurality of resonators comprising:

a vacuum chamber;

a cooler device having a cold stage within the vacuum chamber;

a holder device holding on the cold stage a filter having a plurality of resonators made of a superconducting material;

a conductive plate having an opening which corresponds in shape to each of the plurality of resonators, the conductive plate being constructed to cover all the plurality of resonators other than one of the plurality of resonators which is to be subjected to a resonance frequency measurement; and a rotary body for rotating the conductive plate within the vacuum chamber.

12. The apparatus as in claim 11, further comprising:

a fixing member for fixing the conductive plate to the rotary body; and a probe device attached to the fixing member to measure the resonance frequency.

13. The apparatus as in claim 11, wherein:

the plurality of resonators are arranged generally regularly on a substrate in a circular direction of the substrate.

14. The method as in claim 1, wherein the covering with the conductive plate the all the plurality of resonators other than the one resonator provides a gap between the resonators and the conductive plate.

15. The method as in claim 1, wherein the conductive plate is disposed in parallel with the substrate with a gap between the conductive plate and the substrate.

16. The method as in claim 1 wherein; the covering with the conductive plate the all the plurality of resonators other than the one resonator that is to be subjected to the resonance frequency measurement protects the one resonator from being interfered with by the all the plurality of resonators other than the one resonator.

* * * * *